(12) United States Patent
Kiadeh et al.

(10) Patent No.: US 9,357,302 B2
(45) Date of Patent: May 31, 2016

(54) SYSTEM AND METHOD FOR EXTRACTING PARAMETERS OF A SPEAKER WITHOUT USING STIMULUS

(71) Applicant: Maxim Integrated Products, Inc., San Jose, CA (US)

(72) Inventors: Mansur Kiadeh, Cupertino, CA (US); Vivek Nigam, Milpitas, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 93 days.

(21) Appl. No.: 14/474,646

(22) Filed: Sep. 2, 2014

(65) Prior Publication Data

US 2015/0237444 A1 Aug. 20, 2015

Related U.S. Application Data

(60) Provisional application No. 61/941,140, filed on Feb. 18, 2014.

(51) Int. Cl.
*H04R 3/04* (2006.01)
*H03G 5/00* (2006.01)

(52) U.S. Cl.
CPC . *H04R 3/04* (2013.01); *H03G 5/005* (2013.01)

(58) Field of Classification Search
None
See application file for complete search history.

(56) References Cited

U.S. PATENT DOCUMENTS

| | | | | |
|---|---|---|---|---|
| 4,628,530 A | * | 12/1986 | Op De Beek | H03G 5/165 381/103 |
| 5,206,912 A | * | 4/1993 | Noro | H04R 3/002 381/59 |
| 6,760,451 B1 | * | 7/2004 | Craven | H03G 5/005 381/59 |
| 7,065,221 B1 | * | 6/2006 | Tanaka | H04R 3/04 381/59 |
| 2013/0251164 A1 | * | 9/2013 | Gautama | H04R 29/001 381/59 |
| 2015/0010171 A1 | * | 1/2015 | Pernici | H03F 3/1855 381/120 |

* cited by examiner

*Primary Examiner* — Brenda Bernardi

(57) ABSTRACT

A system includes a plurality of channels, a parameter calculator, and an equalizer. Each channel receives a plurality of input signals that represent an input to a speaker. Each channel generates real and imaginary components of a transfer function of the speaker based on the plurality of input signals. The parameter calculator calculates a plurality of parameters of the speaker based on the real and imaginary components of the transfer function received from each channel. The equalizer adjusts the input to the speaker based on the parameters.

18 Claims, 5 Drawing Sheets

SYSTEM AND METHOD FOR EXTRACTING PARAMETERS OF A SPEAKER WITHOUT USING STIMULUS

CROSS-REFERENCE TO RELATED APPLICATIONS

This application claims the benefit of U.S. Provisional Application No. 61/941,140, filed on Feb. 18, 2014. The entire disclosure of the application referenced above is incorporated herein by reference.

FIELD

The present disclosure relates generally to controlling speakers and more particularly to systems and methods for extracting parameters of speakers without using stimulus in order to adaptively control the dynamic performance of speakers.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Speakers are used in many systems and devices. For example, speakers are used in systems in concert halls, home theaters, automobiles, and so on. Speakers are also used in devices such as smartphones, laptop computers, and so on. In these systems and devices, audio signals including music and speech are typically amplified, and the amplified signals are input to the speakers.

SUMMARY

A system comprises a plurality of channels, a parameter calculator, and an equalizer. Each channel receives a plurality of input signals that represent an input to a speaker. Each channel generates real and imaginary components of a transfer function of the speaker based on the plurality of input signals. The parameter calculator calculates a plurality of parameters of the speaker based on the real and imaginary components of the transfer function received from each channel. The equalizer adjusts the input to the speaker based on the parameters.

In other features, the parameters include a resonance frequency of the speaker, a quality factor of the speaker, and a DC value of an impedance of the speaker.

In other features, in response to the plurality of input signals being sampled at a sampling rate greater than or equal to a predetermined sampling rate, the transfer function is a continuous transfer function, and the parameters include a resonance frequency of the speaker, a quality factor of the speaker, and a DC value of an impedance of the speaker.

In other features, in response to the plurality of input signals being sampled at a sampling rate less than or equal to a predetermined sampling rate, the transfer function is a discrete transfer function, and the parameters include a plurality of coefficients of the discrete transfer function. The parameter calculator calculates a resonance frequency of the speaker, a quality factor of the speaker, and a DC value of an impedance of the speaker based on the plurality of coefficients of the discrete transfer function.

In other features, each channel comprises a plurality of band-pass filters, a cosine generator, and a plurality of correlators. The plurality of band-pass filters respectively filter the plurality of input signals and that output a plurality of sine wave signals. The cosine generator generates a cosine wave signal based on one of the plurality of sine wave signals. The plurality of correlators correlate the plurality of sine wave signals and the cosine wave signal and generate the real and imaginary components of the transfer function of the speaker.

In other features, the plurality of band-pass filters have a center frequency, and the center frequency is different in each channel and is selected based on a resonance frequency of the speaker.

In other features, the plurality of input signals include a voltage signal and a current signal received from an amplifier that drives the speaker, and each channel comprises a first band-pass filter, a second band-pass filter, a cosine generator, a first correlator, an a second correlator. The first band-pass filter filters the current signal and outputs a first sine wave signal. The second band-pass filter filters the voltage signal and outputs a second sine wave signal. The cosine generator generates a cosine wave signal based on the first sine wave signal. The first correlator correlates the first sine wave signal and the cosine wave signal and generates first real and imaginary components of the transfer function. The second correlator correlates the first and second sine wave signals and the cosine wave signal and generates second real and imaginary components of the transfer function. The parameter calculator calculates the plurality of parameters of the speaker based on the first and second real and imaginary components of the transfer function.

In other features, the first and second band-pass filters have a center frequency, and the center frequency is different in each channel and is selected based on a resonance frequency of the speaker.

In still other features, a method comprises receiving, in each of a plurality of channels, a plurality of input signals representing an input to a speaker; and generating, in each of the plurality of channels, real and imaginary components of a transfer function of the speaker based on the plurality of input signals. The method further comprises calculating a plurality of parameters of the speaker based on the real and imaginary components of the transfer function received from each channel, and adjusting the input to the speaker based on the parameters.

In other features, the parameters include a resonance frequency of the speaker, a quality factor of the speaker, and a DC value of an impedance of the speaker.

In other features, in response to the plurality of input signals being sampled at a sampling rate greater than or equal to a predetermined sampling rate, the transfer function is a continuous transfer function, and the parameters include a resonance frequency of the speaker, a quality factor of the speaker, and a DC value of an impedance of the speaker.

In other features, in response to the plurality of input signals being sampled at a sampling rate less than or equal to a predetermined sampling rate, the transfer function is a discrete transfer function, and the parameters include a plurality of coefficients of the discrete transfer function. The method further comprises calculating a resonance frequency of the speaker, a quality factor of the speaker, and a DC value of an impedance of the speaker based on the plurality of coefficients of the discrete transfer function.

In other features, the method further comprises, in each channel, filtering, using a plurality of band-pass filters, the plurality of input signals and outputting a plurality of sine wave signals; generating a cosine wave signal based on one of the plurality of sine wave signals; and correlating the plurality of sine wave signals and the cosine wave signal and generating the real and imaginary components of the transfer function of the speaker.

In other features, the method further comprises selecting, based on a resonance frequency of the speaker, a different center frequency for the plurality of band-pass filters in each channel.

In other features, the plurality of input signals include a voltage signal and a current signal received from an amplifier that drives the speaker, and the method further comprises, in each channel filtering, using a first band-pass filter, the current signal and outputting a first sine wave signal; and filtering, using a second band-pass filter, the voltage signal and outputting a second sine wave signal. The method further comprises generating a cosine wave signal based on the first sine wave signal; correlating the first sine wave signal and the cosine wave signal and generating first real and imaginary components of the transfer function; and correlating the first and second sine wave signals and the cosine wave signal and that generating second real and imaginary components of the transfer function. The method further comprises calculating the plurality of parameters of the speaker based on the first and second real and imaginary components of the transfer function.

In other features, the method further comprises selecting, based on a resonance frequency of the speaker, a different center frequency for the first and second band-pass filters.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

AC parameters of a speaker include a resonance frequency and a quality factor (Q factor) of the speaker. DC parameters of the speaker include a DC impedance of the speaker. The AC and DC parameters (hereinafter parameters) of the speaker can vary during operation of the speaker. For example, the parameters can vary due to changes in temperature of the speaker. Variations in the parameters can distort the output of the speaker. The distortion can be alleviated by adjusting the input to the speaker according to the variations in the parameters.

An equalizer can be used to control the input to the speaker to alleviate the distortion and the power potential of the speaker. Specifically, the parameters of the speaker can be extracted to adaptively control an equalizer in a feed-forward path of a system that drives the speaker. The equalizer uses the parameters to control the input to the speaker so that the speaker can output more power (loudness) without causing physical damage to the speaker and without degrading (e.g., distorting) the output of the speaker.

One way of extracting the parameters of the speaker includes using external stimulus. Some implementations also use least mean square and/or FFT techniques. The present disclosure uses neither an external stimulus nor least mean square and/or FFT techniques to extract the parameters of the speaker. The present disclosure does not use an external stimulus to extract the parameters of the speaker.

Instead, the present disclosure extracts the parameters of the speaker based on the sound input to the speaker. The AC and DC parameters of the speaker are extracted using a transfer function approach. The parameters are extracted continuously and are supplied to an equalizer in the feed-forward path of the system that drives the speaker. The equalizer adjusts the input to the speaker based on the parameters so that the output of the speaker is not distorted despite variations in the parameters.

Figure 1:
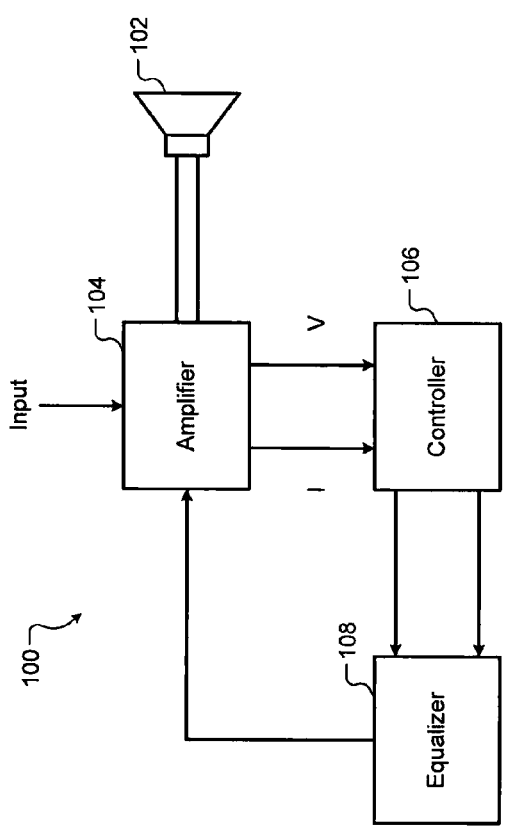
FIG. 1 is a functional block diagram of a system that controls a speaker.

Referring now to FIG. 1, a system 100 comprises a speaker 102, an amplifier 104, a controller 106, and an equalizer 108. The amplifier 104 receives an input. The input may include audio signals or electrical representations of the audio signals. The amplifier 104 amplifies the input and supplies the amplified signals to the speaker 102. The speaker 102 converts the amplified signals into sound waves and outputs the sound waves.

The controller 106 receives current and voltage signals from the amplifier 104. The current and voltage signals represent the input supplied by the amplifier 104 to the speaker 102. The controller 106 extracts the parameters of the speaker 102 from the current and voltage signals as explained below. The controller 106 supplies the parameters to the equalizer 108. The equalizer 108 outputs control signals to the amplifier 104 to adjust the input to be supplied to the speaker 102 based on the parameters. The amplifier 104 supplies the input adjusted based on the control signals to the speaker 102. Based on the adjusted input, the output of the speaker 102 is not distorted despite variations in the parameters of the speaker 102.

Figure 2:
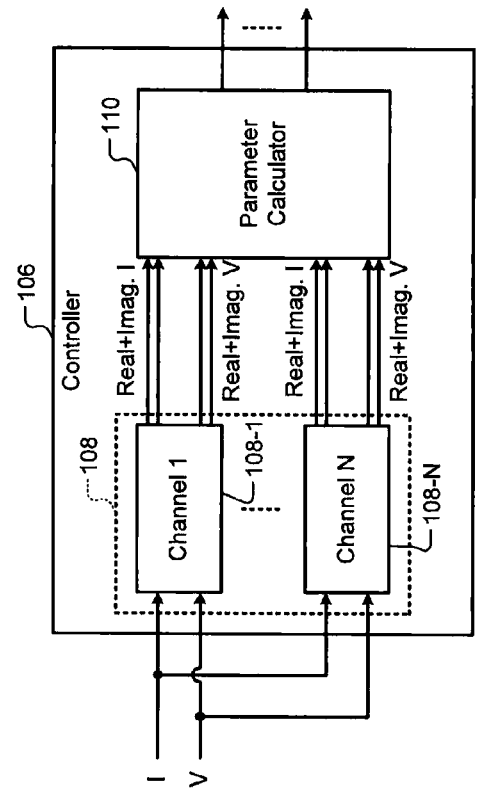
FIG. 2 is a functional block diagram of a controller used in the system of FIG. 1 to extract parameters of the speaker.

Referring now to FIG. 2, the controller 106 comprises a channel 108-1, ..., and a channel 108-N, where N is an integer greater than one, (collectively channels 108); and a parameter calculator 110. Each of the channels 108 receives the current and voltage signals from the amplifier 104. Each of the channels 108 filters and correlates the current and voltage signals and outputs real and imaginary components of a transfer function of the speaker 102. The parameter calculator 110 calculates a plurality of parameters of the speaker 102 based on the real and imaginary components of the transfer function received from each channel.

Figure 3:
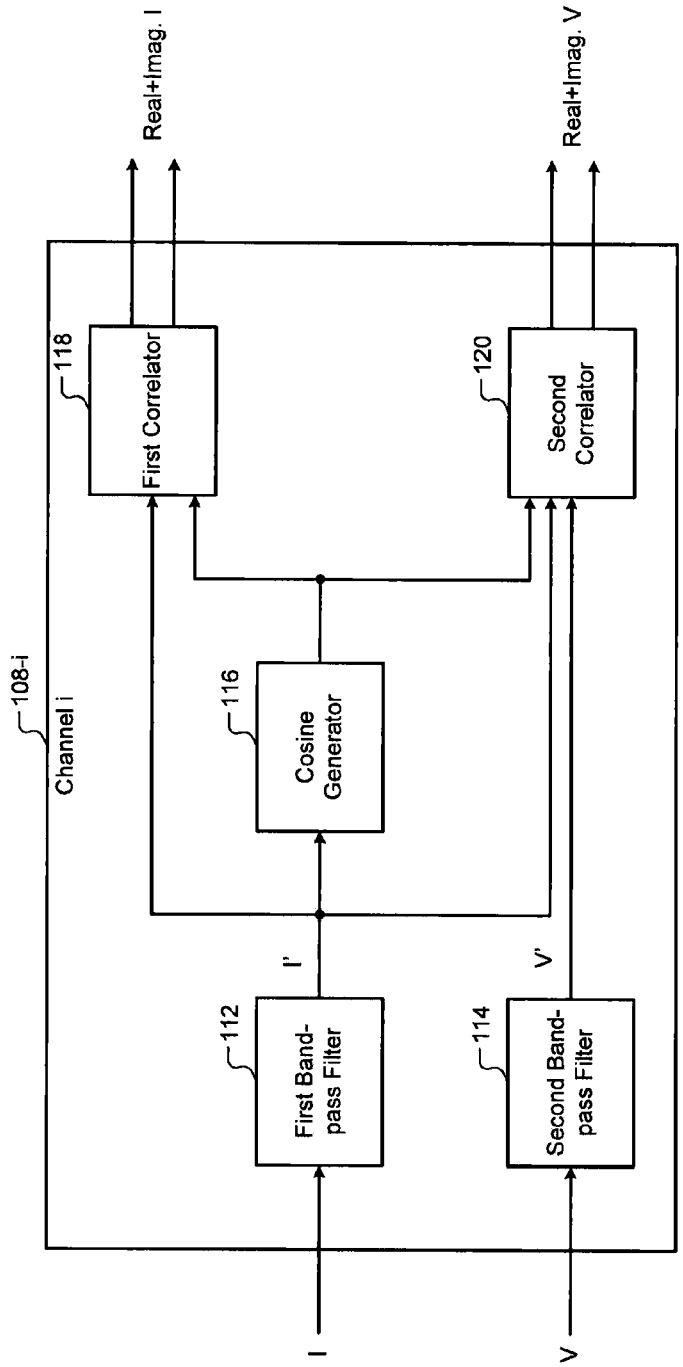
FIG. 3 is a functional block diagram of a channel of the controller of FIG. 2.

Referring now to FIG. 3, one of the channels 108 (e.g., channel i 108-$i$, where $1 \leq i \leq N$, hereinafter channel 108) is shown. The channel 108 comprises a first bandpass filter 112, a second bandpass filter 114, a cosine generator 116, a first correlator 118, and a second correlator 120. The first bandpass filter 112 filters the current signal and generates a filtered current signal. The second bandpass filter 114 filters the voltage signal and generates a filtered voltage signal. The cosine generator 116 generates a cosine signal based on the filtered current signal. The first correlator 118 correlates the filtered current signal and the cosine signal and generates first real and imaginary components of the transfer function of the speaker 102. The second correlator correlates the filtered current and voltage signals and the cosine signal and generates second real and imaginary components of the transfer function of the speaker 102. The parameter calculator 110 calculates the parameters of the speaker 102 based on the first and second real and imaginary components of the transfer function of the speaker 102 received from each of the channels 108.

Figure 4:
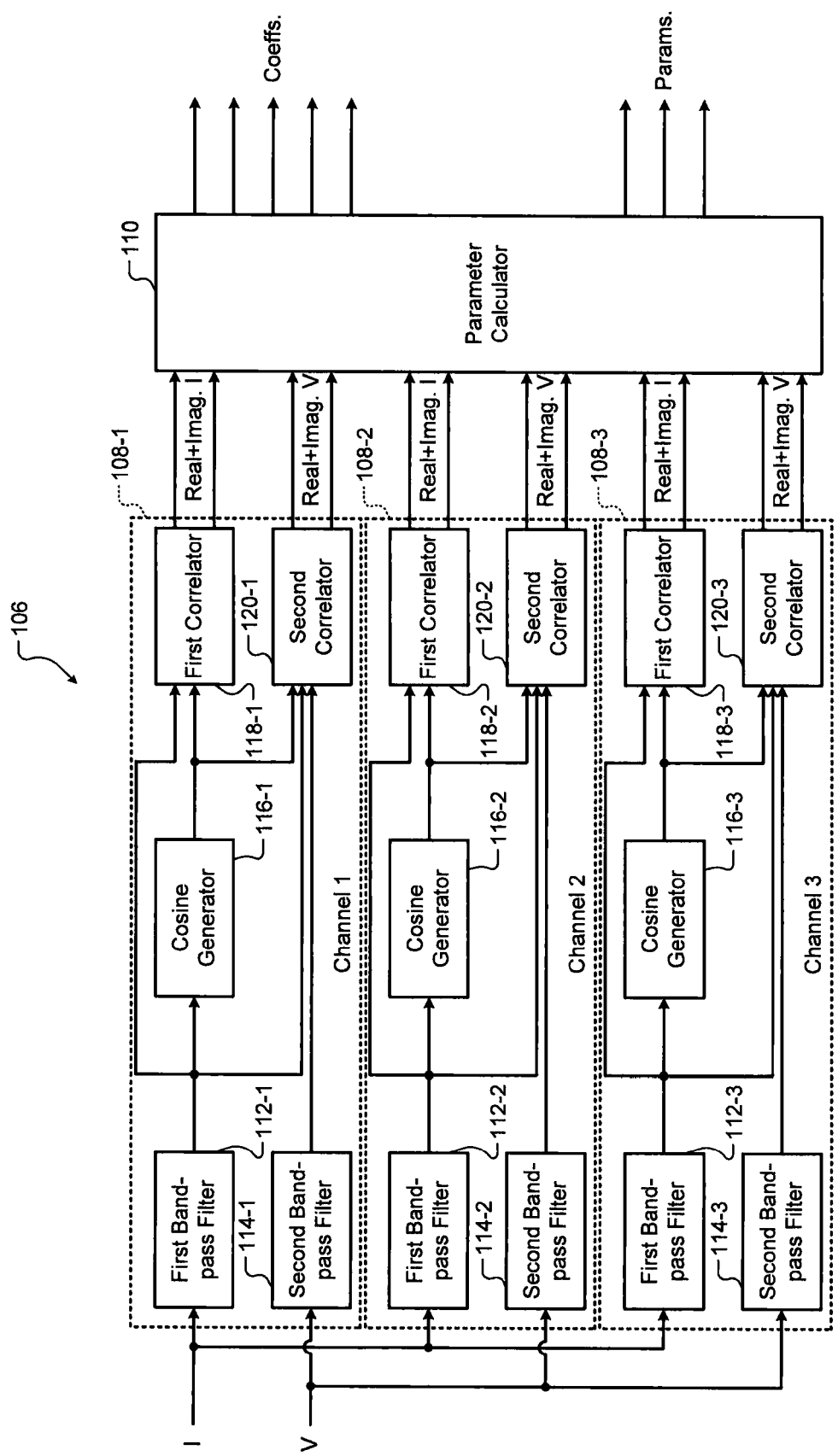
FIG. 4 is an example of the controller of FIG. 2 including three channels.

Referring now to FIG. 4, an example of the controller 106 is shown. For example only, the controller 106 comprises three channels: a first channel 108-1, a second channel 108-2, and a third channel 108-3; and the parameter calculator 110. The first channel 108-1 comprises a first bandpass filter 112-1, a second bandpass filter 114-1, a cosine generator 116-1, a first correlator 118-1, and a second correlator 120-1. The second channel 108-2 comprises a first bandpass filter 112-2, a second bandpass filter 114-2, a cosine generator 116-2, a first correlator 118-2, and a second correlator 120-2. The third channel 108-3 comprises a first bandpass filter 112-3, a second bandpass filter 114-3, a cosine generator 116-3, a first correlator 118-3, and a second correlator 120-3.

In each of the first, second, and third channels 108-1, 108-2, and 108-3, operations of the first and second bandpass filters, the cosine generator, and the first and second correlators are similar to the operations of the first and second bandpass filters 112 and 114, the cosine generator 116, and the first and second correlators 118 and 120 described with reference to FIG. 3.

In each of the first, second, and third channels 108-1, 108-2, and 108-3, each bandpass filter has a different center frequency. Specifically, in the first channel 108-1, the first bandpass filter 112-1 and the second bandpass filter 114-1 have a first center frequency. In the second channel 108-2, the first bandpass filter 112-2 and the second bandpass filter 114-2 have a second center frequency. In the third channel 108-3, the first bandpass filter 112-3 and the second bandpass filter 114-3 have a third center frequency. The first, second, and third center frequencies are selected based on the type of the speaker 102. For example, the first, second, and third center frequencies are selected based on a resonance frequency of the speaker 102.

Each of the first, second, and third channels 108-1, 108-2, and 108-3 receives the current and voltage signals from the amplifier 104 and generates first and second real and imaginary components of the transfer function of the speaker 102. The parameter calculator 110 receives the first and second real and imaginary components of the transfer function of the speaker 102 from each of the first, second, and third channels 108-1, 108-2, and 108-3. The parameter calculator 110 calculates the parameters of the speaker 102 based on the first and second real and imaginary components of the transfer function of the speaker 102 received from each of the first, second, and third channels 108-1, 108-2, and 108-3.

In one implementation, the current and voltage signals may be sampled at a sampling rate less than or equal to a predetermined sampling rate. In such an implementation, the transfer function of the speaker 102 may be a discrete transfer function, and the parameter calculator 110 may calculate coefficients of the transfer function of the speaker 102 instead of calculating the parameters of the speaker 102. As explained below, the parameters of the speaker 102, which include a resonance frequency, a Q factor, and a DC impedance of the speaker 102, can then be calculated based on the coefficients of the transfer function of the speaker 102.

In another implementation, the current and voltage signals may be sampled at a sampling rate greater than or equal to a predetermined sampling rate. In such an implementation, the transfer function of the speaker 102 may be a continuous transfer function, and the parameter calculator 110 may calculate the parameters of the speaker 102 instead of calculating the coefficients of the transfer function of the speaker 102.

Figure 5:
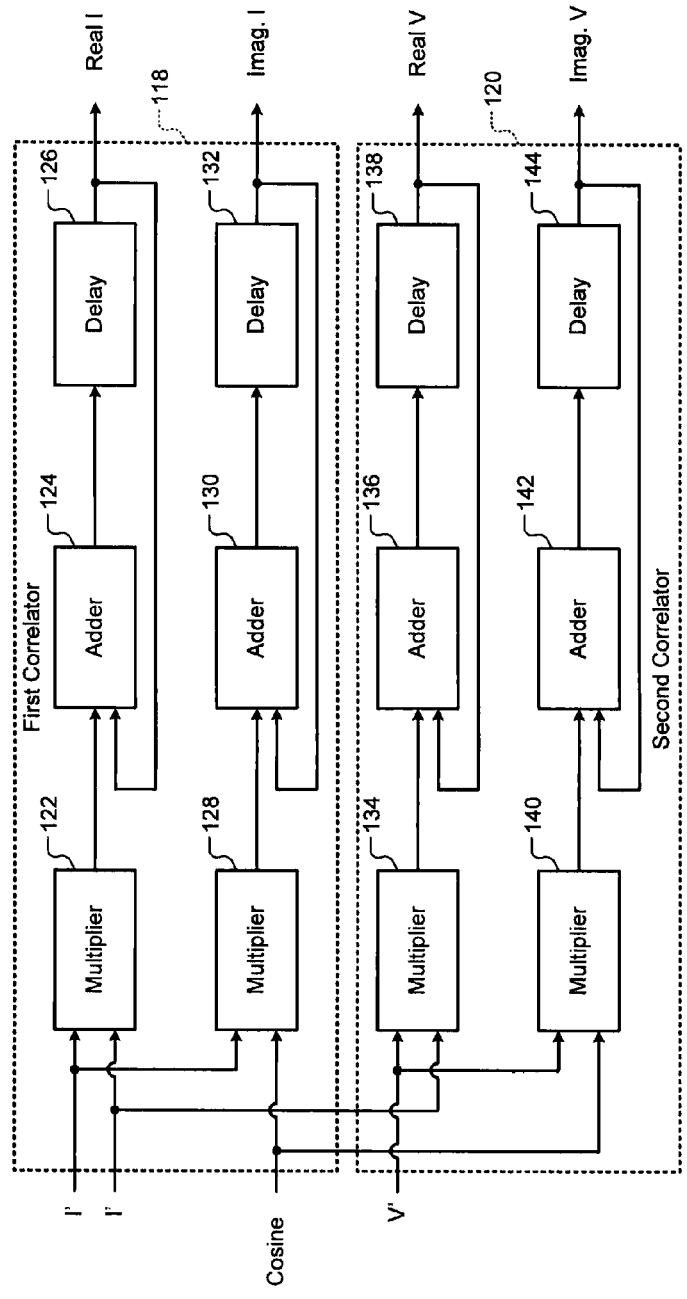
FIG. 5 is an example of correlators used in the controller of FIG. 2.

Referring now to FIG. 5, an example of the first correlator 118 and the second correlator 120 is shown. The first correlator 118 comprises a first multiplier 122, a first adder 124, and a first delay circuit 126. The first multiplier 122 receives the filtered current signal output by the first bandpass filter 112 as input signals. The output of the first multiplier 122 is connected to a first input of the first adder 124. The output of the first adder 124 is connected to the first delay circuit 126. The output of the first delay circuit 126 is connected to a second input of the first adder 124. The output of the first delay circuit 126 represents the real part of the current component of the transfer function of the speaker 102.

Additionally, the first correlator 118 comprises a second multiplier 128, a second adder 130, and a second delay circuit 132. The second multiplier 128 receives the filtered current signal output by the first bandpass filter 112 and the cosine signal output by the cosine generator 116 as input signals. The output of the second multiplier 128 is connected to a first input of the second adder 130. The output of the second adder 130 is connected to the second delay circuit 132. The output of the second delay circuit 132 is connected to a second input of the second adder 130. The output of the second delay circuit 132 represents the imaginary part of the current component of the transfer function of the speaker 102.

The second correlator 120 comprises a first multiplier 134, a first adder 136, and a first delay circuit 138. The first multiplier 134 receives the filtered current signal output by the first bandpass filter 112 and the filtered voltage signal output by the second bandpass filter 114 as input signals. The output of the first multiplier 134 is connected to a first input of the first adder 136. The output of the first adder 136 is connected to the first delay circuit 138. The output of the first delay circuit 138 is connected to a second input of the first adder 136. The output of the first delay circuit 138 represents the real part of the voltage component of the transfer function of the speaker 102.

Additionally, the second correlator 120 comprises a second multiplier 140, a second adder 142, and a second delay circuit 144. The second multiplier 140 receives the filtered voltage signal output by the second bandpass filter 114 and the cosine signal output by the cosine generator 116 as input signals. The output of the second multiplier 140 is connected to a first input of the second adder 142. The output of the second adder 142 is connected to the second delay circuit 144. The output of the second delay circuit 144 is connected to a second input of the second adder 142. The output of the second delay circuit 144 represents the imaginary part of the voltage component of the transfer function of the speaker 102.

Figure 6:
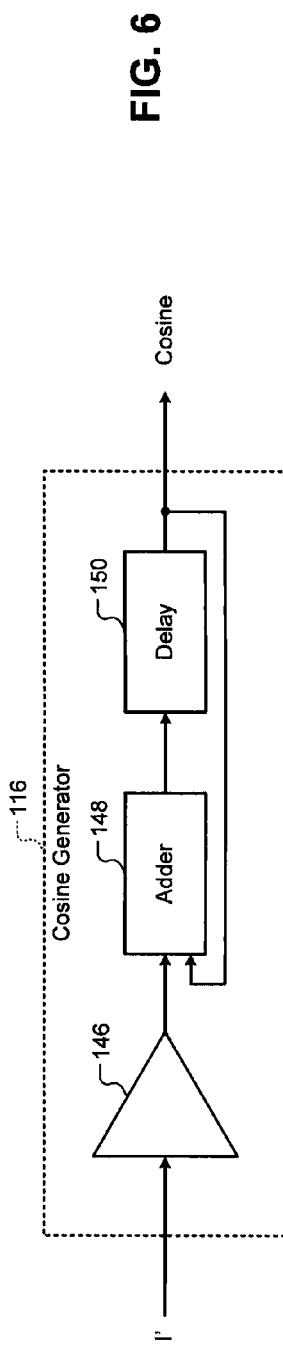
FIG. 6 is an example of a cosine generator used in the controller of FIG. 2.

Referring now to FIG. 6, an example of the cosine generator 116 as shown. The cosine generator 116 comprises an amplifier 146, an adder 148, and a delay circuit 150. The amplifier 146 receives the first filtered signal output by the first bandpass filter 112. The output of the amplifier 146 is connected to a first input of the adder 148. The output of the adder 148 is connected to the delay circuit 150. The output of the relay circuit 150 is connected to a second input of the adder 148. The output of the delay circuit 150 is the cosine signal.

Figure 7:
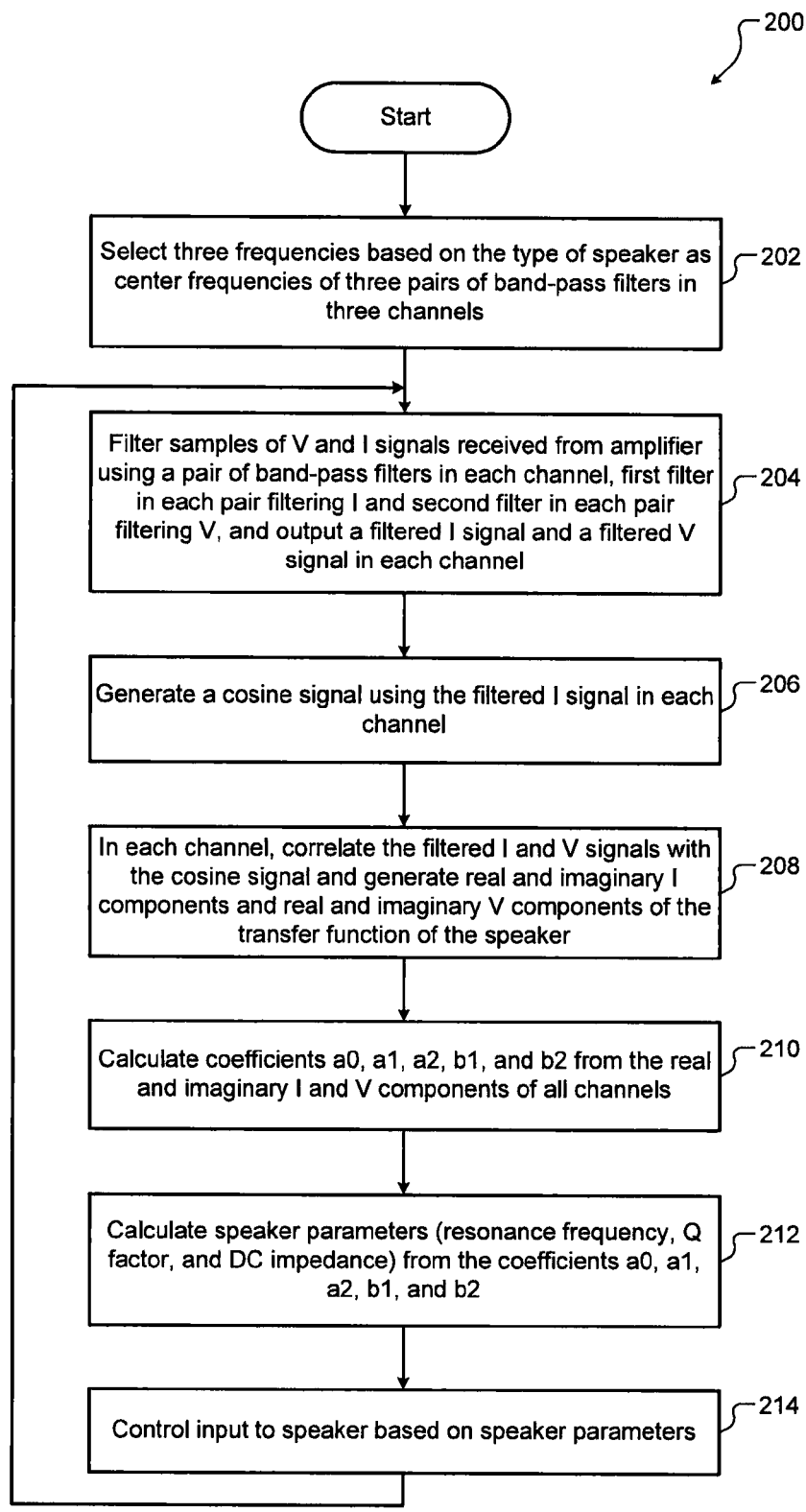
FIG. 7 is a flowchart of a method for extracting parameters of a speaker using a transfer function approach and without using an external stimulus.

Referring now to FIG. 7, a method 200 for extracting parameters of a speaker without using external stimulus is shown. At 202, for example, center frequencies of three pairs of bandpass filters in three channels are selected based on the type of speaker. At 204, samples of current and voltage signals received from an amplifier are filtered by the bandpass filters in each channel. The first bandpass filter in each channel filters the current signal and outputs a filtered current signal. The second bandpass filter in each channel filters the voltage signal and outputs a filtered voltage signal.

At 206, a cosine signal is generated using the filtered current signal in each channel. At 208, in each channel, the filtered current and voltage signals and the cosine signal are correlated and real and imaginary current components and real and imaginary voltage components of the transfer function of the speaker are generated.

At 210, coefficients of the transfer function of the speaker are calculated from the real and imaginary current and voltage components of the transfer function received from each channel. At 212, parameters of the speaker (resonance frequency, Q factor, DC impedance) are calculated from the coefficients of the transfer function of the speaker. At 214, input to the speaker is controlled based on the parameters.

Figure 8:
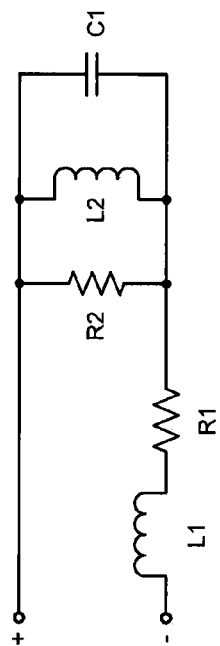
FIG. 8 is a schematic of an impedance of a speaker.

Referring now to FIG. 8, a model of an impedance of a speaker (e.g., the speaker 102) is shown. For example, for a speaker of an electric guitar, L1=300e-6 Henry, R1=6 Ohms, R2=40 Ohms, L2=12e-3 Henry, and C1=320e-6 Farad.

Mathematically, a transfer function for an impedance of a speaker can be expressed in discrete and continuous domains respectively by the following equations.

$$\frac{V(z)}{I(z)} = \frac{b0 + b1 \cdot z^{-1} + b2 \cdot z^{-2}}{1 + a1 \cdot z^{-1} + a2 \cdot z^{-2}}$$

$$\frac{(b2 - b1 + b0)s^2T^2 + (4b0 - 4b2)sT + 4b2 + 4b1 + 4b0}{(a2 - a1 + 1)s^2T^2 + (4 - 4a2)sT + 4a2 + 4a1 + 4}$$

where a1, a2, b0, b1, and b2 are coefficients of the transfer function; s denotes Laplace Transform; and T denotes time.

For example, for the speaker of the electric guitar, a value of the discrete transfer function at a sampling frequency of Fs=4 kHz can be obtained using the following equation:

$H(z)=V(z)/I(z)=(6*z^2-11.02*z+5.112)/(z^2-1.965*z + 0.9807)$

Alternatively, for the speaker of the electric guitar, a value of the continuous transfer function can be obtained using the following equation:

$H(s)=(2.304e05*s^2+0.0138*s+6)/(3.84e-06*s^2+ 0.0003*s +1)$

In the example of the controller 106 comprising three channels 108-1, 108-2, and 108-3 shown in FIG. 4, the discrete transfer function of the speaker 102 can be expressed by the following equation:

$H(z)=V(z)/I(z)$ $H(w1)=R1+jI1$ $H(w2)=R2+jI2$ $H(w3)=R3+jI3$ $Z=\exp(-wnTs)$ $\exp(-w1Ts)=Re1+jIe1$ $\exp(-w2Ts)=Re2+jIe2$ $\exp(-w3Ts)=Re3+jIe3$ where wn (n=1, 2, 3) is frequency in radians per second, Ts is sample time, Ren (n=1, 2, 3) is real component, and Ien (n=1, 2, 3) is imaginary component.

The cosine wave generation shown in FIG. 6 can be mathematically expressed as follows. Let X denote sine function; Y denote cosine function; wn denote frequency in radians per second; Ts denote sample time; and R denote signal amplitude.
Then, $X(t)=R*\cos(wn*t)$    Eq. (1)

$dX(t)=-R*wn*\sin(t)*dt$    Eq. (2)

$Y(t)=R*\sin(wn*t)$    Eq. (3)

$dY(t)=-R*wn*\cos(t)*dt$    Eq. (4)

From equations 2 and 3, we get:

$dX(t)=-R*wn*(Y/R)*dt=-wn*Y(t)*dt.$

From equations 1 and 4, we get:

$dY(t)=-R*wn*(X/R)*dt =wn*X(t)*dt.$

In discrete domain, $dX=X(k+1)-x(k);$ $dY=Y(k+1)-y(k);$ dt=Ts, sample time;

k=$k^{th}$ sample; and (k+1)=$(k+1)^{th}$ sample.

Therefore, $X(k+1)-x(k)=-Ts*wn*T(k);$ and $Y(k+1)-y(k)=-Ts*wn*X(k+1).$

Or $X(k)=X(k+1)+Ts*wn*Y(k);$ and $Y(k)=Y(k+1)-Ts*wn*X(k+1)$ where X(k) represents a sine wave signal (e.g., input to the cosine generator 116); and where Y(k) represents a cosine wave signal (e.g., output of the cosine generator 116).

The parameter calculation performed by the parameter calculator 110 can be mathematically explained as follows. The parameter calculator 110 calculates a coefficient vector expressed by the following matrix equation.

Ax=B, where x is the coefficient vector expressed as follows.

$x=B*A^{-1}=[a0, a1, a2, b1, b2];$ and where the matrix A is expressed as follows.

$$A = \begin{bmatrix} 1 & Re1 & Re1s & (-R1^*Re1+I1^*Ie1) & -R1^*Re1s+I1^*Ie1s \\ 0 & Ie1 & Ie1s & (-R1^*Ie1-I1^*Re1) & -R1^*Ie1s-I1^*Re1s \\ 1 & Re2 & Re2s & (-R2^*Re2+I2^*Ie2) & -R2^*Re2s+I2^*Ie2s \\ 0 & Ie2 & Ie2s & (-R2^*Ie2-I2^*Re2) & -R2^*Ie2s-I2^*Re2s \\ 1 & Re3 & Re3s & (-R3^*Re3+I3^*Ie3) & -R3^*Re3s+I3^*Ie3s \\ 0 & Ie3 & Ie3s & (-R3^*Ie3-I3^*Re3) & -R3^*Ie3s-I3^*Re3s \end{bmatrix},$$

where $Re1 = \cos(-w1^*Ts); Re2 = \cos(-w2^*Ts); Re3 = \cos(-w3^*Ts);$ $Re1s = \cos(-2^*w1^*Ts); Re2s = \cos(-2^*w2^*Ts); Re3s = \cos(-2^*w3^*Ts);$ $Ie1 = \sin(-w1^*Ts); Ie2 = \sin(-w2^*Ts); Ie3 = \sin(-w3^*Ts);$ $Ie1s = \sin(-2^*w1^*Ts); Ie2s = \sin(-2^*w2^*Ts); Ie3s = \sin(-2^*w3^*Ts);$ $R1 = \text{real}(h(1)); I1 = \text{imag}(h(1));$ $R2 = \text{real}(h(2)); I2 = \text{imag}(h(2));$ and $R3 = \text{real}(h(3)); I3 = \text{imag}(h(3)).$ The coefficient vector can be expressed by the equation coeff=A/B, which gives:

$a0e = \text{coeff}(1);$ $a1e = \text{coeff}(2);$ $a2e = \text{coeff}(3);$ $b1e = \text{coeff}(4);$ and $b2e = \text{coeff}(5).$ That is, $ae = [a0e \; a1e \; a2e];$ and $be = [91 \; b1e \; b2e].$ The parameters of the speaker, which include the resonance frequency of the speaker denoted by "fce," the Q factor of the speaker denoted by "qce," and the DC value of the impedance of the speaker denoted by "Rdc", can be calculated from the coefficients of the transfer function using the following equations.

$Fce = \text{sqrt}((be(3)+be(2)+1)/(be(3)-be(2)+1))/(Ts^*pi);$ $Qce = (be(3)+be(2)+1)/(2^*pi^*fce^*Ts^*(1-be(3)));$ and $Rdc = (ae(1)+ae(2)+ae(3))/(1+be(2)+be(3)).$ The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

What is claimed is:

1. A system comprising:
   a plurality of channels, wherein each channel receives a plurality of input signals that represent an input to a speaker, and wherein each channel generates real and imaginary components of a transfer function of the speaker based on the plurality of input signals;
   a parameter calculator that calculates a plurality of parameters of the speaker based on the real and imaginary components of the transfer function received from each channel; and
   an equalizer that adjusts the input to the speaker based on the parameters.

2. The system of claim 1 wherein the parameters include a resonance frequency of the speaker, a quality factor of the speaker, and a DC value of an impedance of the speaker.

3. The system of claim 1 wherein in response to the plurality of input signals being sampled at a sampling rate greater than or equal to a predetermined sampling rate, the transfer function is a continuous transfer function, and the parameters include a resonance frequency of the speaker, a quality factor of the speaker, and a DC value of an impedance of the speaker.

4. The system of claim 1 wherein in response to the plurality of input signals being sampled at a sampling rate less than or equal to a predetermined sampling rate, the transfer function is a discrete transfer function, and the parameters include a plurality of coefficients of the discrete transfer function.

5. The system of claim 4 wherein the parameter calculator calculates a resonance frequency of the speaker, a quality factor of the speaker, and a DC value of an impedance of the speaker based on the plurality of coefficients of the discrete transfer function.

6. The system of claim 1 wherein each channel.comprises:
   a plurality of band-pass filters that respectively filter the plurality of input signals and that output a plurality of sine wave signals;
   a cosine generator that generates a cosine wave signal based on one of the plurality of sine wave signals; and
   a plurality of correlators that correlate the plurality of sine wave signals and the cosine wave signal and that generate the real and imaginary components of the transfer function of the speaker.

7. The system of claim 6 wherein the plurality of band-pass filters have a center frequency, and wherein the center frequency is different in each channel and is selected based on a resonance frequency of the speaker.

8. The system of claim 1 wherein the plurality of input signals include a voltage signal and a current signal received from an amplifier that drives the speaker, and wherein each channel comprises:
   a first band-pass filter that filters the current signal and that outputs a first sine wave signal;
   a second band-pass filter that filters the voltage signal and that outputs a second sine wave signal;
   a cosine generator that generates a cosine wave signal based on the first sine wave signal;
   a first correlator that correlates the first sine wave signal and the cosine wave signal and that generates first real and imaginary components of the transfer function; and
   a second correlator that correlates the first and second sine wave signals and the cosine wave signal and that generates second real and imaginary components of the transfer function,
   wherein the parameter calculator calculates the plurality of parameters of the speaker based on the first and second real and imaginary components of the transfer function.

9. The system of claim 8 wherein the first and second band-pass filters have a center frequency, and wherein the center frequency is different in each channel and is selected based on a resonance frequency of the speaker.

10. A method comprising:
   receiving, in each of a plurality of channels, a plurality of input signals representing an input to a speaker;
   generating, in each of the plurality of channels, real and imaginary components of a transfer function of the speaker based on the plurality of input signals;
   calculating a plurality of parameters of the speaker based on the real and imaginary components of the transfer function received from each channel; and
   adjusting the input to the speaker based on the parameters.

11. The method of claim 10 wherein the parameters include a resonance frequency of the speaker, a quality factor of the speaker, and a DC value of an impedance of the speaker.

12. The method of claim 10 wherein in response to the plurality of input signals being sampled at a sampling rate greater than or equal to a predetermined sampling rate, the transfer function is a continuous transfer function, and the parameters include a resonance frequency of the speaker, a quality factor of the speaker, and a DC value of an impedance of the speaker.

13. The method of claim 10 wherein in response to the plurality of input signals being sampled at a sampling rate less than or equal to a predetermined sampling rate, the transfer function is a discrete transfer function, and the parameters include a plurality of coefficients of the discrete transfer function.

14. The method of claim 13 further comprising calculating a resonance frequency of the speaker, a quality factor of the speaker, and a DC value of an impedance of the speaker based on the plurality of coefficients of the discrete transfer function.

15. The method of claim 10 further comprising, in each channel:
   filtering, using a plurality of band-pass filters, the plurality of input signals and outputting a plurality of sine wave signals;
   generating a cosine wave signal based on one of the plurality of sine wave signals; and
   correlating the plurality of sine wave signals and the cosine wave signal and generating the real and imaginary components of the transfer function of the speaker.

16. The method of claim 15 further comprising selecting, based on a resonance frequency of the speaker, a different center frequency for the plurality of band-pass filters in each channel.

17. The method of claim 10 wherein the plurality of input signals include a voltage signal and a current signal received from an amplifier that drives the speaker, the method further comprising, in each channel:
   filtering, using a first band-pass filter, the current signal and outputting a first sine wave signal;
   filtering, using a second band-pass filter, the voltage signal and outputting a second sine wave signal;
   generating a cosine wave signal based on the first sine wave signal;
   correlating the first sine wave signal and the cosine wave signal and generating first real and imaginary components of the transfer function;
   correlating the first and second sine wave signals and the cosine wave signal and that generating second real and imaginary components of the transfer function; and
   calculating the plurality of parameters of the speaker based on the first and second real and imaginary components of the transfer function.

18. The method of claim 17 further comprising selecting, based on a resonance frequency of the speaker, a different center frequency for the first and second band-pass filters.

* * * * *